US005315120A

United States Patent [19]

Potter

[11] Patent Number: 5,315,120

[45] Date of Patent: May 24, 1994

[54] UNIVANE RFQ

[75] Inventor: James M. Potter, Los Alamos, N. Mex.

[73] Assignee: AccSys Technology, Inc., Pleasanton, Calif.

[21] Appl. No.: 73,165

[22] Filed: Jun. 7, 1993

[51] Int. Cl.[5] .............................................. H01J 37/147

[52] U.S. Cl. ................................ 250/396 R; 250/292; 328/233; 315/5.41

[58] Field of Search ............................ 250/292, 396 R; 328/233; 315/5.41

[56] References Cited

U.S. PATENT DOCUMENTS 4,885,470 12/1989 Abbott ............................ 250/396 R 4,949,047 8/1990 Hayward et al. ................... 328/233

*Primary Examiner*—Jack I. Berman

*Attorney, Agent, or Firm*—Kolisch, Hartwell, Dickinson, McCormack & Heuser

[57] ABSTRACT

A radio-frequency quadrupole which includes four, extruded, identical cross-section, elongate structural components, each of which lacks any longitudinally extending plane of bilateral assembly. Joinder of these components to form a quadrupole body results in an overall axial cross-sectional configuration which has an infinite number of claims of inverted bilateral symmetry extending in all radial directions relative to the long axis of that body. Coolant-carrying boreholes extend longitudinally throughout each component with precise location and proper longitudinal-axial-parallelism.

6 Claims, 1 Drawing Sheet

UNIVANE RFQ

FIELD OF THE INVENTION

This invention relates to linear accelerators, and more specifically to a segmented, radio-frequency quadrupole.

BACKGROUND AND SUMMARY OF THE INVENTION

It is typical in the prior art relating to this area of technology for a radio-frequency quadrupole to have a main body formed, fundamentally, from four, elongate electrode structures, or segments, which include elongate vane tips opposing each other in pairs, and disposed symmetrically about the long axis of the quadrupole. These tips function to concentrate, accelerate and focus a beam of particles in a stream along that axis.

Prior to the advent of the present invention, such segments, normally four in number (as mentioned), which are assembled in the final quadrupole unit to form an appropriate confronting vane-tip configuration with surrounding wall structure, have included, typically, two different kinds of segments, configured with two, quite different cross-sectional configurations. Good illustrations of this situation are found in the disclosures of U.S. Pat. Nos. 4,885,470 (Integrally Formed Radio Frequency Quadrupole) and 4,949,047 (Segmented RFQ Accelerator). Given this kind of construction, it is obvious that the manufacturing process must deal with proper, differentiated forming and machining of two differently shaped segments, and any inventory of segments maintained in a preassembly state must necessarily include both kinds of required segments.

As part of the ever-present need, and commercial desire, to increase simplicity, and to reduce manufacturing and assembling costs, designers in this field have sought ways to deal with the necessary cross-sectional configurations of the usually required four segments, in the hope of addressing these issues. In this setting, the structure proposed by the present invention offers an extraordinary step forward, by providing, and demonstrating, that each of the four segments typically required to build a radio-frequency quadrupole can have a cross section which is identical to that of each other segment. This advance in the art clearly makes an important stride toward improved simplicity, and in addition, greatly minimizes costs relating to manufacture and maintenance of inventory. As an important example of the greatly improved manufacturability of a segment formed in accordance with this invention, what might be thought of as raw segment material can, foundationally, be formed through a process of extrusion, with extruded product then cut into whatever lengths are chosen by a designer. Any final machining operations thereafter, with the exception of certain specific differences required in vane tip configurations, are then exactly the same for each of the four segments required to put together a quadrupole.

Significantly, extruding allows for the precise creation and placement of longitudinally extending coolant-carrying boreholes—boreholes which, in prior art approaches, have had to be drilled, with all of the attendant problems of drill-bit "wanderlust"—the tendency, typically, of a drill bit to drift off axis beyond about 24-inches of drilling depth.

As will become apparent from the drawing illustrations herein, and from the description of the invention which follows, the novel segment structure of this invention springs from a unique asymmetry which exists in segment cross section, which asymmetry ultimately allows four segment units to be joined in such a fashion that the finally assembled unit contains the appropriate degree of bilateral symmetry required in a quadrupole assembly.

Various other objects and advantages which are attained by the invention will become more readily apparent as the mentioned description of the invention which now follows is read in conjunction with the two drawing figures that form part of this disclosure.

DETAILED DESCRIPTION OF THE INVENTION

Turning attention now to both drawing figures, indicated generally at 10 is a radio-frequency quadrupole, and more particularly the main body of such a quadrupole, which body is made up of four common-, or like-, cross-section segments, or structural components, 12, 14, 16, 18. These segments, which preferably have been formed of extruded aluminum, are shown assembled to form the main body of the quadrupole, and to define the central, or accelerating, axis 10*a* in the quadrupole.

Figure 1:
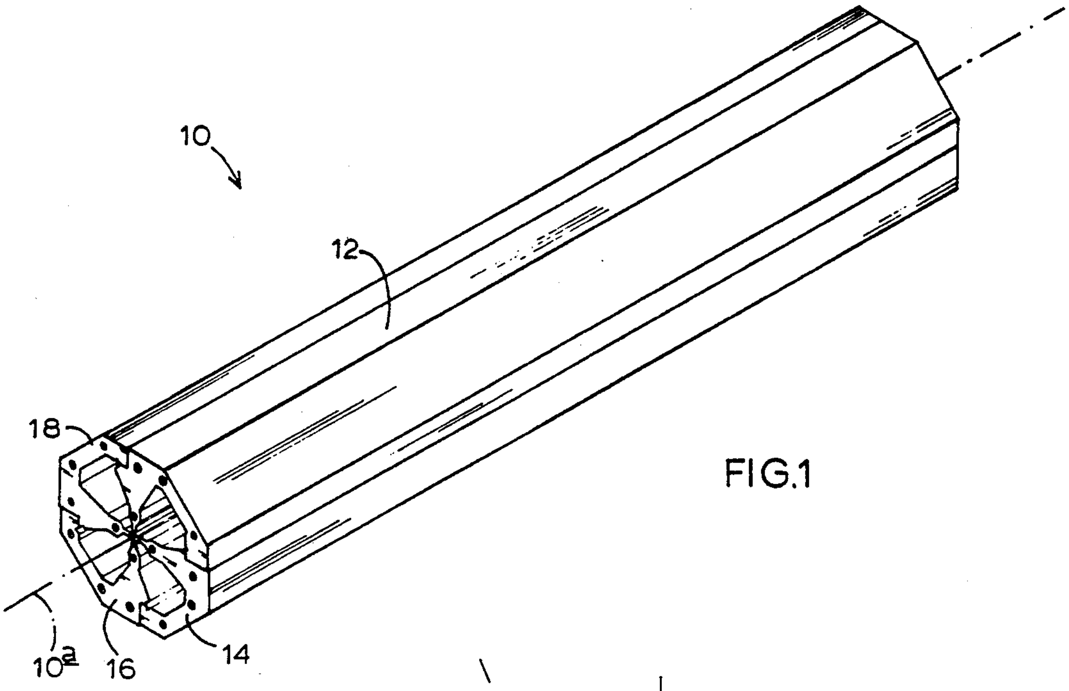
FIG. 1 is an isometric view of the main body of a radio-frequency quadrupole constructed with segments, also referred to herein as structural components, formed in accordance with the contributions and teachings of the present invention.
Figure 2:
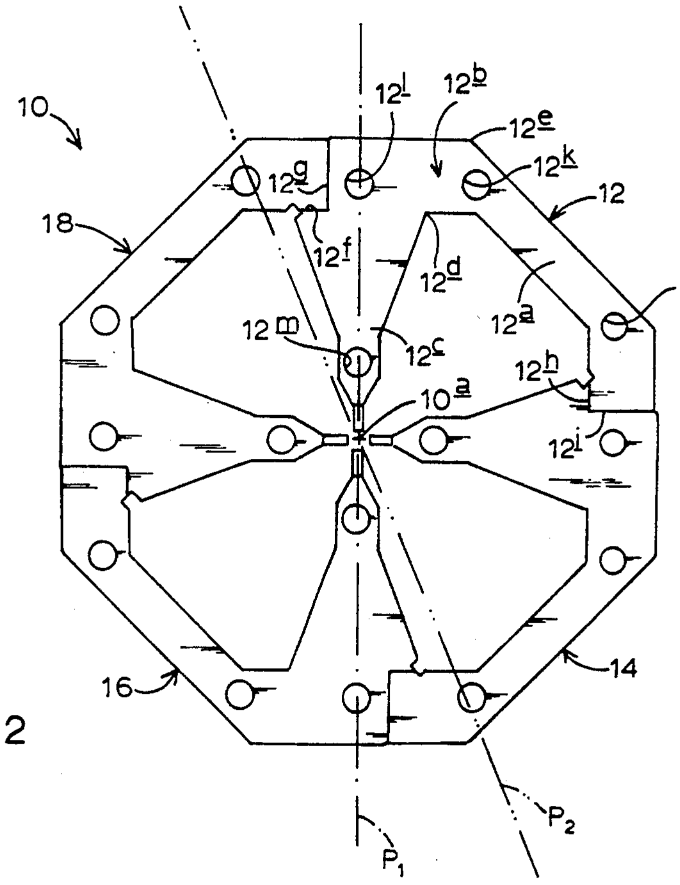
FIG. 2 is an enlarged, cross-sectional view taken generally along the axis of the assembled quadrupole body illustrated in FIG. 1.

As can be seen especially in FIG. 2, each segment, as viewed thus in cross section, has a high degree of asymmetry, and includes a wall portion, such as wall portion 12*a*, joined right-angularly through a region of joinder, such as region 12*b*, with a vane portion, such as vane portion 12*c*. As viewed in FIG. 2, and referring specifically to the portions of segment 12 which have just been identified, the region of joinder 12*b* therein defines what can be thought of as inside and outside corner subportions 12*d*, 12*e*, respectively. Further, each segment includes plural joinder edges, such as joinder edges 12*f*, 12*g*, 12*h*, 12*i* in segment 12, which come together in matching, complementary fashion in the assembly with complementary, counterpart joinder edges formed in the adjacent segments. Extending with precise, axial-parallelism location throughout the length of each segment are extruded boreholes, such as boreholes 12*j*, 12*k*, 12*l*, 12*m* in segment 12, for accommodating the flow of operational coolant fluid.

Thus, what can be seen very clearly in FIG. 2 is that the four, illustrated structural components, or segments, that make up the body of the quadrupole have identical axial cross-sectional configurations, and that these configurations lack any longitudinally extending (normal to the plane of FIG. 2) plane of bilateral symmetry, and in fact lack any like-extending central plane of symmetry. Yet, when they come together with one another to form the body assembly illustrated, they join in such a fashion that they produce substantial cross-sectional symmetry, and in this regard, one can view such symmetry as having inverted, bilateral symmetrical characteristics with respect to an infinite number of planes which intersect the plane of FIG. 2 at a right angle and which contain axis 10*a*. Two such planes are illustrated at $P_1$ and $P_2$ in FIG. 2. The term "bilateral" just used relates to what is visible in the assembled cross section on the opposite sides of these illustrated planes, and the term "inverted" refers to the fact that what one sees, on opposite sides of these planes, is an image where what is on, say, the left side of the plane is mirrored on the right side of the plane, but in an inverted fashion.

A unique radio-frequency quadrupole segment construction is thus proposed by this invention. Those skilled in the art will recognize that all of the features and advantages called out above for, and springing from, the contributions made by this invention, are indeed handily and clearly provided by the proposed structure.

Within the scope of the claims to this invention, we recognize, as will those skilled in the art, that variations and modifications may be made which will come within the grasp of those claims.

It is claimed and desired to secure by Letters Patent:

1. A radio-frequency quadrupole comprising four elongate structural components having elongate joinder edges and joinable adjacent one another along said edges to form an elongate quadrupole body, each of said components having the same axial cross-sectional configuration.

2. A radio-frequency quadrupole comprising four elongate structural components each having an axial cross-sectional configuration lacking any longitudinally extending plane of bilateral symmetry, and elongate joinder edges in said components accommodating unifying edge-to-edge joinder of the components to form a quadrupole body characterized by an assembled axial cross-sectional configuration having an infinite number of planes of inverted bilateral symmetry extending in all radial directions relative to the long axis of such a body.

3. The quadrupole of claims 1 or 2, wherein each of said structural components is formed by extrusion, with each including at least one elongate, extruded borehole capable of carrying coolant fluid.

4. An elongate structural component assembleable with other like components to form the body of a radio-frequency quadrupole comprising a wall portion, and a vane portion joined to said wall portion and together therewith defining an axial, transverse cross section lacking any central plane of symmetry.

5. An elongate structural component assembleable with other like components to form the body of a radio-frequency quadrupole comprising a wall portion, and a vane portion joined to said wall portion in a right-angle-iron fashion to define, in the region of joinder, inside and outside corner subportions.

6. The structural component of claims 4 or 5, which is formed by extrusion, and which includes at least one elongate, extruded borehole capable of carrying coolant fluid.

* * * * *